United States Patent [19]

Downing

[11] Patent Number: 4,910,642
[45] Date of Patent: Mar. 20, 1990

[54] COOLANT ACTIVATED CONTACT COMPACT HIGH INTENSITY COOLER

[75] Inventor: Robert S. Downing, Rockford, Ill.

[73] Assignee: Sundstrand Corporation, Rockford, Ill.

[21] Appl. No.: 279,725

[22] Filed: Dec. 5, 1988

[51] Int. Cl.[4] .................................................. H05K 7/20
[52] U.S. Cl. ...................................... 361/382; 165/908; 357/82; 361/385
[58] Field of Search ............... 174/15.1; 357/82; 165/80.3, 80.4, 908; 361/382, 383, 385, 386, 388

[56] References Cited

U.S. PATENT DOCUMENTS

| | | | |
|---|---|---|---|
| 3,472,077 | 10/1969 | Bucalo | 200/83 D |
| 3,766,834 | 10/1973 | Kraemer | 200/83 C |
| 4,138,692 | 2/1979 | Meeker | 357/82 |
| 4,399,484 | 8/1983 | Mayer | 361/382 |
| 4,431,980 | 2/1984 | Ikesawa | 174/15.1 |
| 4,494,171 | 1/1985 | Bland | 165/908 |
| 4,559,580 | 12/1985 | Lutfy | 361/385 |
| 4,561,040 | 12/1985 | Eastman et al. . | |
| 4,561,041 | 12/1985 | Crowley, Jr. et al. . | |
| 4,633,213 | 12/1986 | Venema | 200/83 D |
| 4,645,001 | 2/1987 | Hillerstrom | 165/908 |
| 4,712,158 | 12/1987 | Kikuchi et al. | 361/385 |
| 4,729,060 | 3/1988 | Yamamoto et al. . | |
| 4,729,076 | 3/1988 | Masami et al. . | |
| 4,740,866 | 4/1988 | Kajiwara et al. . | |

*Primary Examiner*—Gerald P. Tolin
*Attorney, Agent, or Firm*—Antonelli, Terry & Wands

[57] ABSTRACT

A coolant activated contact-compact high intensity cooler (10) for cooling electronic modules and the like has an outer bellows portion (17) and a stack of alternating orifice/target plates (18) and spacer plates (19). Pressurize cooling fluid is caused to pass through orifices (26) in the plates (18) and impinge upon the surface of another plate (18) downstream. The fluid also causes the bellows portion (17) to expand so as to be brought into contact with a heat source.

10 Claims, 2 Drawing Sheets

COOLANT ACTIVATED CONTACT COMPACT HIGH INTENSITY COOLER

TECHNICAL FIELD

The present invention relates to a cooling device used in cooling electronic modules. More particularly, the present invention relates to a coolant activated contact-compact high intensity cooler (CAC-CHIC) device which uses liquid impingement jet cooling within a laminated stack of highly conductive orifice plates separated by spacer plates for cooling electronic modules in, for example, aircraft electronic systems. The present invention is directed to a cooler which permits easy and rapid removal of electronic modules by retraction of the cooler.

BACKGROUND ART

Because of the trend towards miniaturization of electronic devices, higher power dissipation in small packages and thus higher heat fluxes have become a more critical problem. In order to achieve long life and high reliability for electronic systems, it is absolutely essential that adequate cooling be provided for electronic packages.

Systems for cooling electronic components, such as semiconductor chips are well known and take a variety of forms. For example, U.S. Pat. No. 4,712,158, relates to a cooling system for electronic components mounted on a circuit board in which liquid coolant can be completely discharged from a cooling plate when it is necessary to have access to the electronic components. Hollow resilient members are mounted at the open end of a coolant chamber and comprise bellows and a heat transfer piece mounted at the ends of the bellows so as to be in direct and resilient contact with the electronic components. A nozzle pipe protrudes into the coolant chamber toward the heat transfer piece for directing the liquid coolant thereagainst. Coolant can be removed from the cooling plate so that no coolant remains in the chamber, thereby allowing the components to be removed for maintenance purposes or for transfer. However, such a system does not maximize fluid movement within the bellows to minimize stagnation and to enhance heat transfer. Furthermore, the disclosed embodiments direct the cooling fluid against a single heat transfer piece and thus do not maximize the heat transfer area so as to allow dissipation of large quantities of heat which is particularly important for power components.

U.S. Pat. No. 4,729,076, discloses several embodiments of a cooling system using an expandable bellows for an electronic circuit device. One such arrangement uses a cooling module which has a heat transfer plate connected to a header within which a cooling passage permits a coolant to flow by means of a bellows. The heat transfer plate is exposed to the flow of the coolant and is pressed against an electronic circuit component such as a semiconductor provided on a circuit board by means of the bellows actuated by a hydraulic coolant pressure. Another embodiment disclosed in that patent shows a heat transfer plate connected to a header by means of a bellows. A heat transferring compliant member is provided between the heat transfer plate and a circuit component by securing the compliant member to the outer side face of the heat transfer plate or to the circuit component on the printed circuit board. The compliant member is preferably made of an elastic material having a high heat conductivity. A liquid or gas coolant which is circulated by a pump enters a coolant recirculation zone defined in the bellows so that the heat transfer plate is exposed to the coolant at the side face thereof opposite to the compliant member. Although such an arrangement accommodates surface irregularities or misalignment between the cooling device and the electronic circuit, the several embodiments do not provide the advantages which impingement jet cooling provides in terms of movement of fluid to increase the heat transfer coefficient and eliminate stagnation at boundary layers. Furthermore, it does not enhance the area through which heat transfer occurs and thus the efficiency of the system. This is true even though the cited patent also shows the use of a heat transfer stud inside the bellows with cooling fins at the upper end thereof. In addition, there is only a single bellows provided per cooling device. Should there be any leakage in or around the bellows, the effectiveness of the cooling device is entirely lost for that electric component and, depending upon the seriousness of the leakage, possibly the other cooling devices for other components.

U.S. Pat. No. 4,740,866 discloses a sealed type liquid cooling device with an expandable bellows for semiconductor chips. Specific attention is paid to the assembling process shown in FIG. 3 in which a Kovar thin film 1 is coated with a photoresist film and is used as the bellows material. Pressure is applied to join the outer peripheral junction rings and the bellow rings after which the bellow parts are cut and removed and the bellows are stretched. The assembled bellows adjoined to a housing and a cap for a cooling block. The cooling block and the silicon chip are metallically joined by solder. It does not appear that the bellows is intended to expand to and from the silicon chip to be cooled. Whereas a pipe can be used to introduce cooling water into the bellows, this arrangement does not use any wicking devices within the bellows to more rapidly perform heat transfer.

U.S. Pat. No. 4,138,692, shows several embodiments of bellows cooling in which a thermally conductive solid stud is in thermal contact with the bellows. It has been found that such a thermally conductive stud does not provide a satisfactory cooling efficiency when dealing with components generating a substantial amount of heat in that it does not enhance the effective heat transfer area. Furthermore, this arrangement is one in which the stud is to be permanently affixed to the chip and is not intended to be moved to and away from the chip so as to afford the opportunity to replace the chip.

U.S. Pat. No. 4,561,041, also shows a bellows-like cooling system for chips. This cooling system provides an outer and inner bellows which are rigidly connected with a heat sink which, in turn, is bonded in a rigid fashion to a heat sink cooling chip provided with narrowly spaced grooves on an upper side thereof. Glass plates having axially and radially extending ducts are cut into a plate and act as fluid passageways. Again, this arrangement suffers from the fact that it is not intended to be movable up and down and does not provide means inside the bellows to facilitate heat transfer by enhancement of the cooling area. Furthermore, although this patent shows the use of an inner and outer bellows, such an arrangement is not intended to provide a redundancy in the event of leakage of the cooling fluid. Additionally, it is not intended that the bellows be moved into and out of contact with the chip for replacement purposes.

The foregoing problems have been overcome by the provision of a laminated stack of highly conductive orifice plates separated by spacer plates and arranged with a bellows. The orifice plates serve as target plates for impingement jets caused by pressurized fluid coolant issuing from orifices of the immediate upstream plate. Alternate orifice plates have offset or staggered hole patterns so that the impingement jets are directed at the solid surface between the orifices of the immediate downstream plate.

An object of the present invention is to use the area-enhancement advantage of impingement jet cooling in areas where little space is available and in a manner by which electronic modules can be easily replaced.

In order to carry out that object, a laminated stack of plates is arranged with a metal bellows. Fluid coolant flows through the stack, and the metal bellows expand when the coolant is initially pressured to move the cooler assembly into contact with the electronic module which acts as the heat source. A thermally conductive interface elastomer material such as CHO-THERM TM interfaces between the bellows and the module so that any surface irregularities on the module or misalignment between the assembly and module are accommodated without impeding the transfer of heat. When the coolant circuit is depressurized, the spring constant in the bellows will cause the assembly to retract from the module allowing servicing or replacement.

Another object of the present invention is to provide a cooling device which has both a low thermal resistance to a liquid coolant and which is also a separable module.

It is a further object of the present invention to be able to cause the cooling device to move towards and away from the electronics module by activation of the coolant pressure so that the electronics package can be removed when the fluid circuit has been depressurized.

It is still a further object of the present invention to provide a cooling device which is both simple in construction and yet which is highly efficient in its heat removal capability.

It is yet another object of the present invention to provide a coolant activated device where surface irregularities or misalignment between the cooling device itself and the heat source are accommodated by an elastic contact pad or a thermally conductive elastomer such as CHO-THERM TM, a thermal interface material offered by Chomerics, 16 Flagstone Drive, Hudson, NH 03051.

Another object of the present invention is to provide cooling by the use of impingement jets on orifice plates which serve as target plates so as to give extremely high heat transfer coefficients.

Still a further object of the present invention is to provide a coolant activated cooling device wherein the high heat transfer coefficients in combination with the area enhancement afforded by a stack of thin laminate layers provides a very low heat source-to-heat sink thermal resistance.

BRIEF DESCRIPTION OF THE DRAWINGS

These and further features, objects and advantages of the present invention will become more apparent from the following disclosure when taken in conjunction with the accompanying drawings wherein.

BEST MODE FOR CARRYING OUT THE INVENTION

Figure 1:
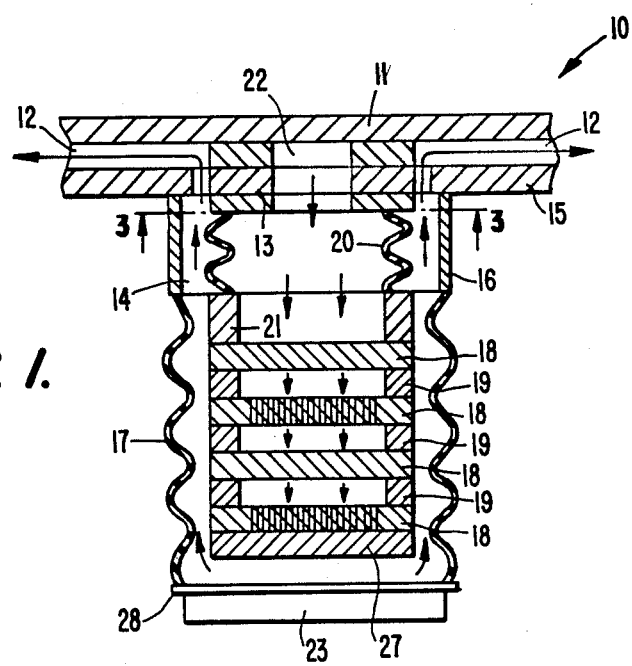
FIG. 1 is an elevational view in cross-section of a presently preferred embodiment of the invention taken along line 1—1 of hereinafter described FIG. 3.
Figure 3:
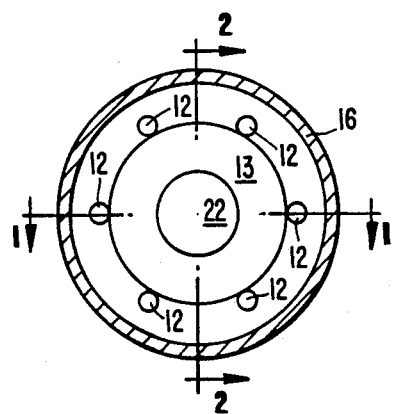
FIG. 3 is a cross-sectional plan view of the device taken along line 3—3 in FIG. 1.
Figure 4:
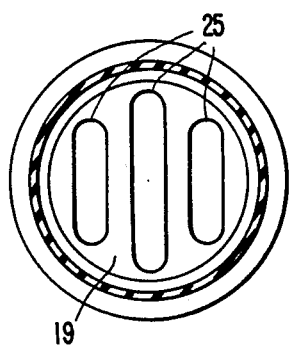
FIG. 4 is a cross-sectional plan view taken along line 5-5 of FIG. 2.
Figure 5:
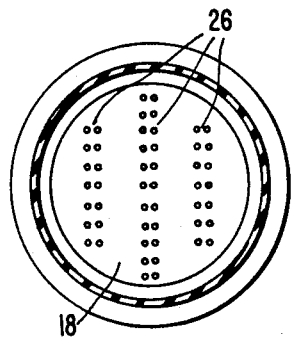
FIG. 5 is a cross-sectional plan view taken along line 5—5 of FIG. 2.

Referring now to the drawings and in particular to FIG. 1, there is shown a CAC-CHIC device in accordance with the present invention designated generally by the numeral 10. The device consists of a cover 11 having a fluid drain passageways 12 disposed in a circular pattern as shown in FIG. 3. An annular depending boss 13 extends from the bottom surface of the cover 11 so as to define a small space 14 from the fluid drain passageway 12. The cover 11 includes a bottom portion 15 whose outer surface has an annular projecting wall 16 which is spaced radially from the depending portion 13 and which defines a bellows support. A metal bellows member 17 is hermetically sealed to the end of the wall 16. The bottom of the bellows 17 is hermetically closed by metal end cap 28 on the bottom surface of which is adhered or bonded a thermally conductive elastomer plate 23 made from CHO-THERM TM or any other suitable elastomer material. A series of alternate orifice/target plates and spacer plates 18,19, respectively, are disposed coaxially within the bellows with an open channel spacer plate 27 located at the bottom surface of the lowermost orifice plate 18 to permit the coolant to return through the channels when the plate 27 abuts against the metal end cap 28 as described below. A small bellows portion 20 connects an annular collar 21 at the upper end of the stack of plates and orifices with the bottom of the annular depending portion 13. It will be appreciated by one skilled in the art that the connection of the bellows portions 17 and 20 to the respective walls and metal end cap is such as to render these volumes hermetically sealed with conventional techniques so that fluid can enter and leave therethrough in defined passageways without any leakage occurring.

Figure 2:
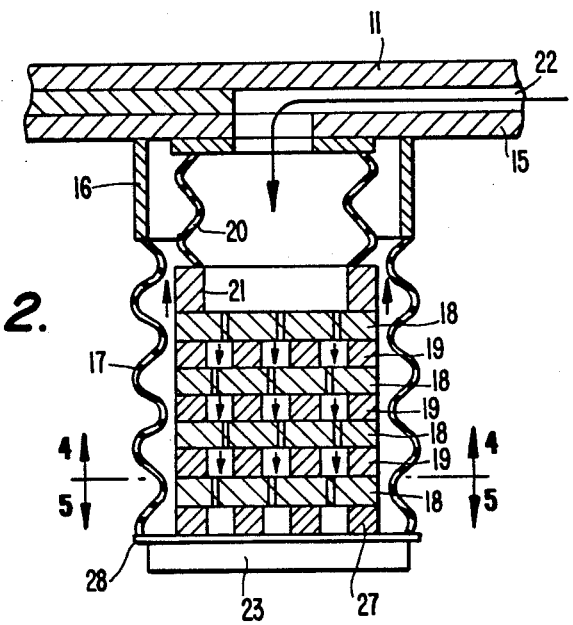
FIG. 2 is a cross-sectional view of the CAC-CHIC assembly in accordance with the present invention taken along line 2—2 of hereinafter described in FIG. 3 and with the bellows extended by the action of pressurized coolant.

A cooling fluid such as water is caused to flow into the device 10 through entry port 22 so that the cooling fluid flows in the interior volume downwardly in the direction of the arrows as shown in FIG. 1. The coolant pressure forces the impingement plate stack 18,19, etc. to move downwardly toward and into contact with the top of the metal end cap 28 and thereafter the outer bellows portion 17 is moved downwardly along with the stack of plates and orifices into contact with the electronic heat source (not shown) to be cooled. This movement is shown in FIG. 2 where the stack has already moved toward the metal end cap 28 as the outer bellows portion 17 moves toward the electronic module.

Figure 6:
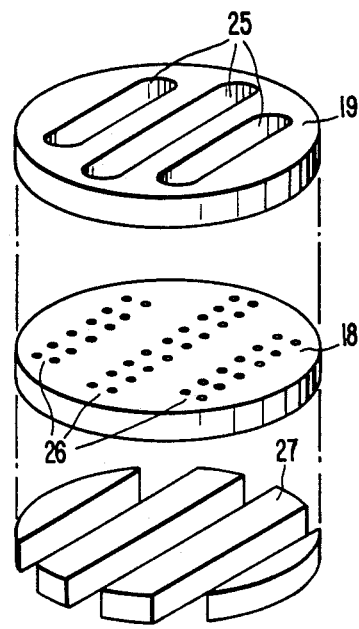
FIG. 6 is an isolated view of the alternate orifice target plate and the spacer plate arrangement which is used in the device of FIG. 1.
Figure 6A:
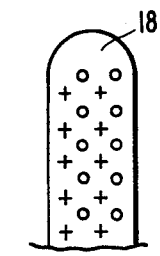
FIG. 6A shows with circles and crosses the staggered or offset pattern of orifices on alternate orifice/target plates.

FIG. 6 shows how the alternate orifice/target plates 18 and spacer plates 19 are arranged. The space plate 19 is provided with oblong slots 25 which overlie the orifice/target plate 18 having a corresponding area in line with the slots 25 but defining a series of orifices or holes 26 in the area of each of the slots. Each hole 26 in the row of holes on the plates 18 are designated schematically by a single line in FIGS. 1 and 2. To provide impingement which increase the heat transfer coefficient by causing movement of the fluid to avoid stagnation, however, the holes 26 in alternating orifice/target plates 18 are offset from each other as shown in FIG. 6A with crosses and circles, wherein the circles represent the pattern on one plate and the crosses represent the pattern on the immediately preceding or succeeding orifice/target plate. In this manner, the cooling liquid which travels down through the stack fully contacts the solid surfaces between the orifices of the plates 18 to effect maximum heat transfer. The cooling fluid then passes through the orifices 26 in the form of jets which impinge upon the solid surface of the downstream orifice/target plate 18 until the fluid exits through the last plate in the vicinity of the elastomer plate 23 after which it is exhausted through the fluid drains 12.

While an embodiment in accordance with the present invention has been shown and described, it is to be clearly understood that the same is susceptible of numerous changes and modifications without departing from the scope of the present invention. Therefore, it is not intended that the present invention be limited to the details shown and described herein but that it cover all such changes and modifications as are encompassed by the scope of the appended claims.

I claim:

1. A compact high intensity cooler assembly adapted to be used as a heat sink for at least one heat generating component, comprising
    an expandable bellows connected to a bellows support and adapted to move into and out of contact with the at least one heat generating component;
    a plurality of spaced orifice plates operatively arranged in the interior of said bellows to provide low thermal resistance impingement cooling of the at least one heat generating component via a fluid coolant; and
    means for selectively supplying the fluid coolant under pressure to an interior of said bellows to move said bellows into contact with the at least one heat generating component and to effect impingement cooling via said plates, and thereafter exhausting the fluid coolant from the assembly.

2. A cooler assembly according to claim 1, wherein the spaced orifice plates are arranged such that orifices in one plate are staggered in relation to orifices in a succeeding plate.

3. A cooler assembly according to claim 1, wherein target plates are arranged between orifice plates.

4. A cooler assembly according to claim 3, wherein the spaced orifice plates are arranged such that orifices in one plate are staggered in relation to orifices in a succeeding plate.

5. A cooler assembly according to claim 4, wherein each target plate has apertures which permit the fluid coolant from one orifice plate to impinge upon the solid surface of the succeeding orifice plate.

6. A cooler assembly according to claim 1, wherein second bellows are connected between a cover with which bellows support is operatively associated and the plurality of spaced orifice plates.

7. A cooler assembly according to claim 6, wherein the spaced orifice plates are arranged such that orifices in one plate are staggered in relation to orifices in a succeeding plate.

8. A cooler assembly according to claim 6, wherein target plates are arranged between orifice plates.

9. A cooler assembly according to claim 8, wherein the spaced orifice plates are arranged such that orifice in one plate are staggered in relation to orifices in a succeeding plate.

10. A cooler assembly according to claim 9, wherein each target plate has apertures which permit the fluid coolant from one orifice plate to impinge upon the solid surface of the succeeding orifice plate.

* * * * *